(12) United States Patent
Qiu

(10) Patent No.: US 10,921,642 B2
(45) Date of Patent: Feb. 16, 2021

(54) MINI LIGHT EMITTING DIODE (LED) BACKLIGHT WITH ADHESIVE FILLED SEAMS AND GROOVES AND THE METHOD OF MANUFACTURING SAME

(71) Applicant: Huizhou China Star Optoelectronics Technology Co., Ltd., Huizhou (CN)

(72) Inventor: Yongyuan Qiu, Huizhou (CN)

(73) Assignee: Huizhou China Star Optoelectronics Technology Co., Ltd., Huizhou (CN)

( * ) Notice: Subject to any disclaimer, the term of this patent is extended or adjusted under 35 U.S.C. 154(b) by 0 days.

(21) Appl. No.: 16/607,150

(22) PCT Filed: May 17, 2019

(86) PCT No.: PCT/CN2019/087494
§ 371 (c)(1),
(2) Date: Oct. 22, 2019

(87) PCT Pub. No.: WO2020/220404
PCT Pub. Date: Nov. 5, 2020

(65) Prior Publication Data
US 2020/0341333 A1   Oct. 29, 2020

(30) Foreign Application Priority Data

Apr. 29, 2019  (CN) .......................... 201910356996.2

(51) Int. Cl.
*G02F 1/13357*   (2006.01)
*H01L 25/075*    (2006.01)
(Continued)

(52) U.S. Cl.
CPC ........ *G02F 1/133603* (2013.01); *B29C 70/88* (2013.01); *F21S 2/005* (2013.01);
(Continued)

(58) Field of Classification Search
CPC .... H01L 25/0753; H05K 1/142; H05K 1/181; G02B 6/0078; F21S 2/005; F21Y 2105/16;
(Continued)

(56) References Cited

U.S. PATENT DOCUMENTS

| 2009/0016671 A1* | 1/2009 | Asai | G02B 6/43 385/14 |
| 2011/0220958 A1* | 9/2011 | Yoneda | G01N 21/8806 257/99 |
| 2020/0113078 A1* | 4/2020 | Kim | H01L 25/0753 |

* cited by examiner

*Primary Examiner* — Andrew J Coughlin
*Assistant Examiner* — Keith G. Delahoussaye

(57) ABSTRACT

A mini light emitting diode (LED) backlight and a method of manufacturing the same are disclosed. The mini LED backlight includes a backboard and a plurality of rectangular light boards provided with a plurality of mini LEDs arranged in an array, and the plurality of light boards are arranged in an array and spliced on the backboard. A seam is provided between two of the light boards adjacent to each other, and the backboard is provided with a plurality of grooves corresponding to the seams, and the plurality of seams and the plurality of grooves are filled with a cured adhesive. The method of manufacturing the corresponding mini LED backlight is further provided. The mini LED backlight and the method of manufacturing the same are capable of effectively improving the problem about dark lines between the light boards of the mini LED backlight.

8 Claims, 3 Drawing Sheets

(51) Int. Cl.
*H01L 33/62* (2010.01)
*F21V 31/00* (2006.01)
*F21V 31/04* (2006.01)
*H05K 1/14* (2006.01)
*F21S 2/00* (2016.01)
*H05K 1/18* (2006.01)
*B29C 70/88* (2006.01)
*F21Y 105/16* (2016.01)
*F21Y 105/10* (2016.01)
*B29L 31/34* (2006.01)

(52) U.S. Cl.
CPC ............ *F21V 31/005* (2013.01); *F21V 31/04* (2013.01); *H01L 25/0753* (2013.01); *H01L 33/62* (2013.01); *H05K 1/142* (2013.01); *H05K 1/181* (2013.01); *B29L 2031/3425* (2013.01); *F21Y 2105/10* (2016.08); *F21Y 2105/16* (2016.08); *G02F 2202/28* (2013.01); *H01L 2933/0066* (2013.01)

(58) Field of Classification Search
CPC .. F21V 31/005; F21V 31/04; G02F 1/133603; B29L 2031/3425; B29C 70/88
See application file for complete search history.

MINI LIGHT EMITTING DIODE (LED) BACKLIGHT WITH ADHESIVE FILLED SEAMS AND GROOVES AND THE METHOD OF MANUFACTURING SAME

RELATED APPLICATIONS

This application is a National Phase of PCT Patent Application No. PCT/CN2019/087494 having International filing date of May 17, 2019, which claims the benefit of priority of Chinese Patent Application No. 201910356996.2 filed on Apr. 29, 2019. The contents of the above applications are all incorporated by reference as if fully set forth herein in their entirety.

FIELD AND BACKGROUND OF THE INVENTION

The present invention relates to the display technical field, and in particular, to a mini light emitting diode (LED) backlight and a method of manufacturing the same.

Mini light emitting diodes (LEDs) are products having a chip with a size of less than 200 micrometers.

Mini LEDs are used in backlight sources of liquid crystal display (LCD) displays in the market because the mini LEDs can achieve an ultra-thin thickness, have multi-subsections being utilized simultaneously, and are the products of small chips. Moreover, the mini LEDs can compete with organic light-emitting diode (OLED) products in actual effect and can be more cost-effective than OLEDs. Thus, the mini LEDs are proposed to be used.

In the mini-LED products, due to limited machines, light boards are small pieces, and the small pieces of the light boards are spliced to a large backlight. The size of a single light board of the mini-LED backlight is limited to a regular size of 300 mm*300 mm (currently conducted on a die bonding machine). Thus, using mini-LED light boards in the large TV backlight would face the problem that multiple mini-LED light boards are required to be spliced.

Refer to FIG. 1A and FIG. 1B, a side view of the conventional structure of the spliced mini LED light boards and a top view of the conventional structure of the spliced mini LED light boards are illustrated. A backboard 1 is provided with a plurality of small pieces of light boards, such as a light board 2 and a light board 3, and the plurality of light boards are spliced to a large backlight. The light board can be manufactured by the printed circuit board, and the light board is provided with a plurality of mini LEDs 4 arranged in an array.

A distance between one of the mini LEDs on the light board 2 close to a seam between the light board 2 and the light board 3 and one of the mini LEDs on the light board 3 close to the seam between the light board 2 and the light board 3 is L and a pitch of two of the mini LEDs adjacent to each other on the same light board is P. Generally, in order to ensure high quality (the pitch of the mini-LEDs associated with the backlight optical distance, i.e. optical density value), when a value of the optical density of the backlight is constant, L=P is desirable to ensure that the brightness transition between the light boards is uniform. However, due to the tolerance of the appearance dimensions between the light board 2 and the light board 3 which are manufactured by the printed circuit boards, there are assembly tolerances in the assembly process in such a manner that L=P cannot be effectively guaranteed to be achieved. When L>P, dark lines appear between the light board 2 and the light board 3. In particular, after the surface of the light board 2 and the light board 3 are coated with white paint, the dark line state further occurs at the seam area due to insufficient reflectivity. When L<P, bright lines appear between the light board 2 and the light board 3.

A distance between one of the mini LEDs close to the seam on the light board and an edge of the light board close to the seam is L1. If L1=L/2, for achieving L=P, the requirements of the size control and assembly accuracy for the light board 2 and the light board 3 are extremely high, resulting in splicing defect. Thus, L1<L/2 is generally desirable for ease of assembly. However, in the condition of L1<L/2, the seams exist, and dark lines appear between the light boards, and thereby the problem related to quality of light emitting still needs to be solved.

SUMMARY OF THE INVENTION

An object of the present invention is to provide a mini LED backlight and a method of manufacturing same, which can solve the problem about dark lines between the light boards of the mini LED backlight.

In order to achieve the aforementioned object, the present invention provides a mini LED backlight, comprising: a backboard; and a plurality of rectangular light boards provided with a plurality of mini LEDs arranged in an array, wherein the plurality of light boards are arranged in an array and spliced on the backboard, a seam is provided between two of the light boards adjacent to each other, the backboard is provided with a plurality of grooves corresponding to the plurality of seams, and the plurality of seams and the plurality of grooves are filled with cured adhesive.

Further, the backboard is an electro-galvanized steel substrate or an aluminum substrate.

Further, an orientation of the grooves corresponds with an orientation of the seams.

Further, the groove has a rectangular cross section, and a width of the groove corresponds with a width of the seam.

Further, a distance between two of the mini LEDs adjacent to each other on the same light board is P, a distance between one of the mini LEDs close to the seam on the light board and an edge of the light board close to the seam is L1, and a width of the groove is X, wherein a relationship of P, L1, and X is: X<P−2L1.

Further, the groove has a depth ranging from 0.2 mm to 0.4 mm.

Further, an upper surface of the adhesive is planar and is flush with an upper surface of the light boards.

Further, an upper surface of the adhesive is a semi-circular protrusion, and the protrusion is slightly higher than an upper surface of the light board.

The present invention further provides a method of manufacturing the mini LED backlight, comprising:

a step S1 of preparing a backboard;

a step S2 of forming a plurality of grooves on the backboard, wherein each of the grooves corresponds to each of seams provided between two of light boards adjacent to each other on the backboard;

a step S3 of disposing a dispensing mold on the backboard;

a step S4 of filling the plurality of grooves with adhesive;

a step S5 of pre-curing the adhesive, removing the dispensing mold when the adhesive is no longer in a fluid state, and then further curing the adhesive; and a step S6 of splicing and fixing a plurality of the light boards on the backboard according to positions of the adhesive disposed on the backboard.

In summary, the mini LED backlight and the method of manufacturing the same of the present invention are capable of effectively improving the problem about dark lines between the light boards of the mini LED backlight.

BRIEF DESCRIPTION OF THE SEVERAL VIEWS OF THE DRAWINGS

The technical solution, as well as beneficial advantages, of the present invention will be apparent from the following detailed description of one or more embodiments of the present invention, with reference to the attached drawings. In the drawings.

DESCRIPTION OF SPECIFIC EMBODIMENTS OF THE INVENTION

Figure 1A:
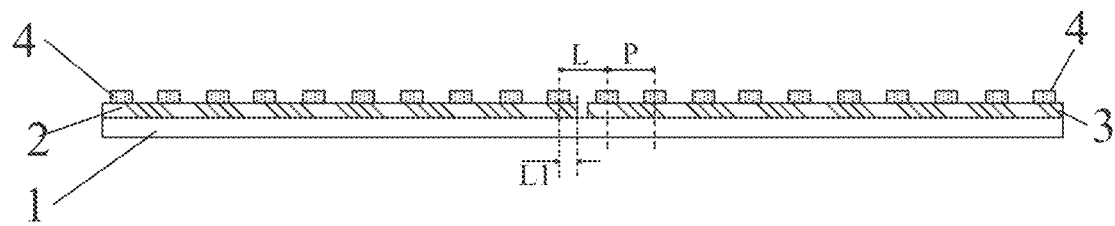
FIG. 1A is a side view of the conventional structure of the spliced mini LED light boards.
Figure 1B:
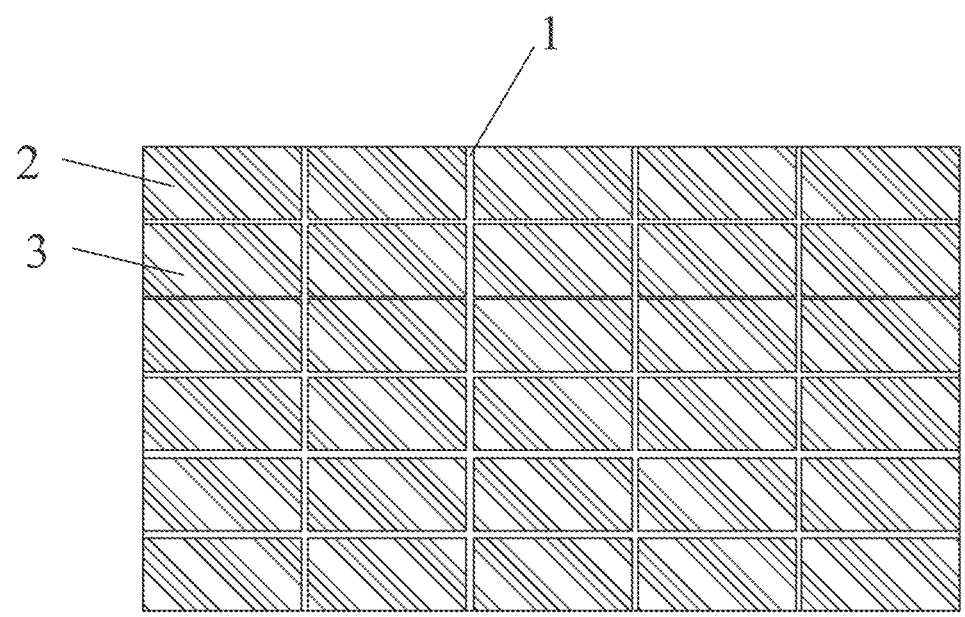
FIG. 1B is a top view of the conventional structure of the spliced mini LED light boards.
Figure 2:
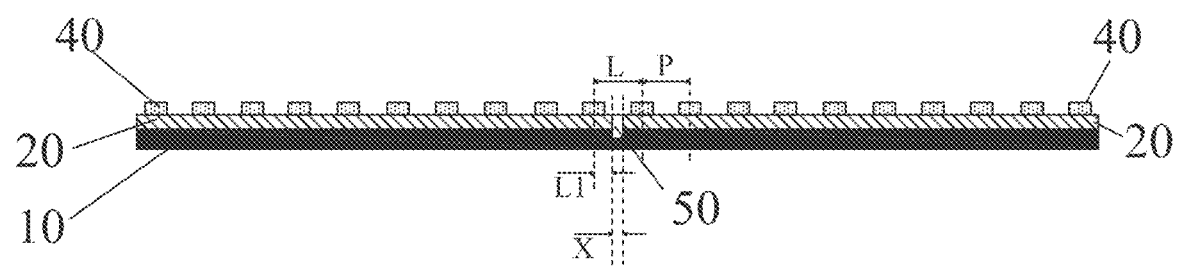
FIG. 2 is a side view a mini LED backlight according to a preferred embodiment of the present invention.

Refer to FIG. 2, a side view showing a mini LED backlight according to a preferred embodiment of the present invention is illustrated, the mini LED backlight mainly comprising: a backboard 10 and a plurality of rectangular light boards 20 provided with a plurality of mini LEDs 40 arranged in an array. The plurality of light boards 20 are arranged in an array and spliced on the backboard 10. A seam is provided between two of the light boards 20 adjacent to each other, and the backboard 10 is provided with a plurality of grooves corresponding to the plurality of seams. The plurality of seams and the plurality of grooves are filled with cured adhesive 50.

In the present invention, the plurality of grooves are configured on the backboard 10, and a plurality of non-grooved portions are used to fix the light boards 20. The plurality of grooves are filled with cured adhesive 50. A height of the adhesive 50 is higher than a height of the groove, and reflectivity of the adhesive 50 is more than 90%, which is similar with reflectivity of the current reflector. The adhesive can be made of a material of PA6T, PA9T, PCT, EMC or SMC. In the present embodiment, an upper surface of the adhesive 50 is planar and is flush with an upper surface of the light boards 10. In other embodiments, an upper surface of the adhesive can be a semi-circular protrusion, and the protrusion is slightly higher than an upper surface of the light board.

Figure 3:
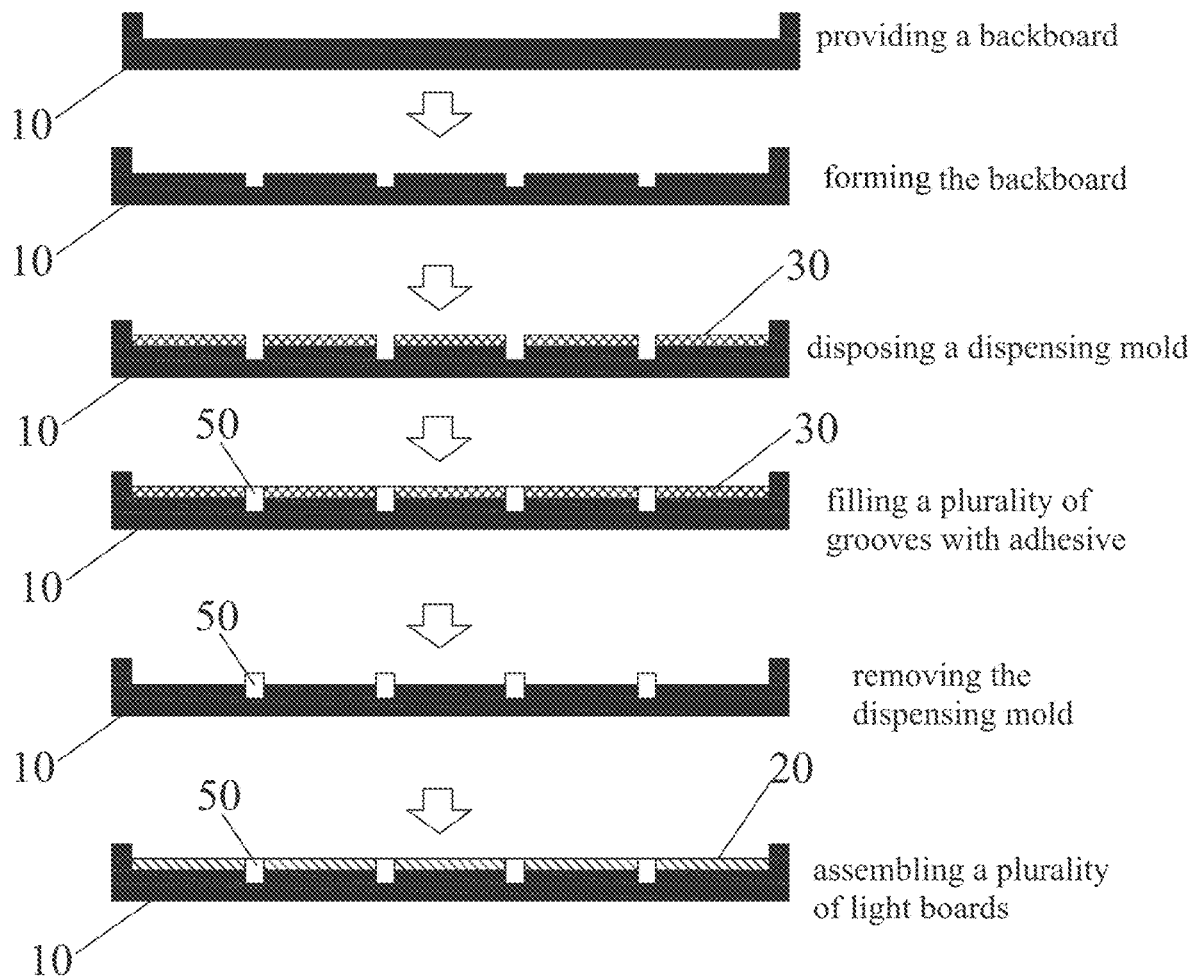
FIG. 3 is a flowchart of a method of manufacturing a mini LED backlight according to a preferred embodiment of the present invention.

The present invention further correspondingly provides a method of manufacturing the mini LED backlight mentioned previously. Refer to FIG. 3, a flowchart of a method of manufacturing a mini LED backlight according to a preferred embodiment of the present invention is illustrated. It will be understood by reference to FIG. 2. In the present invention, a plurality of grooves are formed on the backboard 10 using molding or milling, and then adhesive 50 is injected into the plurality of grooves in such a manner that the reflectivity of a portion between the light boards 20 is the same with the reflectivity of the surface of the light boards 20 by the high reflectivity of the adhesive, and thereby light uniformity can be achieved. The implementation process is as follows, and mainly includes the following steps.

A step S1: preparing a backboard 10. The backboard 10 may be a conventional electro-galvanized steel substrate or an aluminum substrate. The function of heat dissipation of the aluminum substrate is better than that of the electro-galvanized steel substrate. A thickness of the substrate ranges from 0.8 mm to 1 mm.

A step S2: forming a plurality of grooves on the backboard 10. Each of the grooves corresponds to each of seams provided between two of light boards 20 adjacent to each other on the backboard 10. An orientation of the grooves on the backboard corresponds with an orientation of the corresponding seams. The groove may have a rectangular cross section, and a width of the groove corresponds with a width of the seam. The groove can also be other suitable shapes. The grooves on the backboard 10 may be formed by stamping or milling on the electro-galvanized steel substrate or the aluminum substrate. The width of the groove can depend on a distance between two of the mini-LEDs 40 adjacent to each other and a distance between one of the mini-LEDs 40 close to an edge and the edge. As shown in FIG. 2, a distance between two of the mini LEDs adjacent to each other on the same light board 20 is P, a distance between one of the mini LEDs 40 close to the seam on the light board 20 and an edge of the light board 20 close to the seam is L1, and a width of the groove is X. A relationship of P, L1, and X is: X<L−2L1 according to X+2*L1<L. In order to ensure the requirement of quality, L=P is generally requested. Therefore, the width of the groove, i.e. X can be set as X<P−2L1. A depth of the groove may not be specified herein. It is recommended that the depth of the groove ranges from 0.2 mm to 0.4 mm, mainly based on fixing of the adhesive 50 and stiffness of the backboard 10.

A step S3: disposing a dispensing mold on the backboard 10. The dispensing mold 30 is disposed on the formed backboard 10. The dispensing mold 30 can cover an area where the light boards 20 need to be disposed, and the grooves are partially exposed. A height of the dispensing mold 30 can be identical with a thickness of the light board 20 to ensure the height of the filled adhesive 50.

A step S4: filling the plurality of grooves with adhesive 50. The amount of the adhesive 50 is sufficient to fill the entire groove, and an upper surface of the adhesive 50 is flush with an upper surface of the dispensing mold 30. As shown in FIG. 3, the upper surface of the adhesive 50 can be planar and is flush with an upper surface of the dispensing mold 30.

Figure 4:
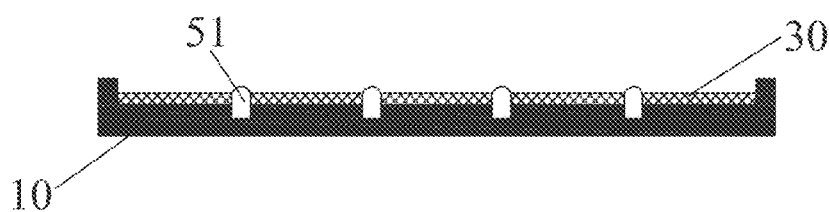
FIG. 4 is a side view of the back adhesive of a mini LED backlight according to another preferred embodiment of the present invention.

Refer to FIG. 4, a side view of the back adhesive of a mini LED backlight according to another preferred embodiment of the present invention is illustrated. As shown in FIG. 4, an upper surface of adhesive 51 is a semi-circular protrusion, and the protrusion is slightly higher than an upper surface of the dispensing mold 30.

A step S5: pre-curing the adhesive 50, and removing the dispensing mold 30 when the adhesive 50 is no longer in a fluid state, then further curing the adhesive 50. The adhesive 50 is completely fixed on the backboard 10 by further curing. The curing of the adhesive 50 can be selected from UV curing or heat curing, which depends on the type of the adhesive, and is not limited herein.

A step S6: splicing and fixing a plurality of the light boards 20 on the backboard 10 according to positions of the adhesive 50 disposed on the backboard 10. The plurality of light boards 20 are adhered to the backboard 10 coated with the adhesive 50, and the light board 20 can be fixed on the backboard 10 by bonding with an adhesive.

As mentioned above, the mini LED backlight and the method of manufacturing the same of the present invention are capable of effectively improving the problem about dark lines between the light boards of the mini LED backlight.

Based on the description above, a person having ordinary skills in the art may contemplate various changes and modifications of the technical solution and technical ideas of the present invention and all these changes and modifications are considered within the protection scope of right for the present invention as defined in the appended claims.

What is claimed is:

1. A method of manufacturing a mini light emitting diode (LED) backlight, comprising:
   a step S1 of preparing a backboard;
   a step S2 of forming a plurality of grooves on the backboard, wherein each of the grooves corresponds to each of seams provided between two of light boards adjacent to each other on the backboard;
   a step S3 of disposing a dispensing mold on the backboard;
   a step S4 of filling the plurality of grooves with adhesive;
   a step S5 of pre-curing the adhesive, removing the dispensing mold when the adhesive is no longer in a fluid state, and then further curing the adhesive; and
   a step S6 of splicing and fixing a plurality of the light boards on the backboard according to positions of the adhesive disposed on the backboard.

2. A mini light emitting diode (LED) backlight, comprising:
   a backboard; and
   a plurality of rectangular light boards provided with a plurality of mini LEDs arranged in an array, wherein the plurality of light boards are arranged in an array and spliced on the backboard, a seam is provided between two of the light boards adjacent to each other, the backboard is provided with a plurality of grooves corresponding to the plurality of seams, and the plurality of seams and the plurality of grooves are filled with a cured adhesive, wherein the backboard is an electro-galvanized steel substrate or an aluminum substrate.

3. The mini LED backlight of claim 2, wherein an orientation of the grooves corresponds with an orientation of the seams.

4. The mini LED backlight of claim 2, wherein the groove has a rectangular cross section, and a width of the groove corresponds with a width of the seam.

5. The mini LED backlight of claim 4, wherein a distance between two of the mini LEDs adjacent to each other on the same light board is P, a distance between one of the mini LEDs close to the seam on the light board and an edge of the light board close to the seam is L1, and a width of the groove is X, wherein a relationship of P, L1, and X is: $X < P - 2L1$.

6. The mini LED backlight of claim 2, wherein the groove has a depth ranging from 0.2 mm to 0.4 mm.

7. The mini LED backlight of claim 2, wherein an upper surface of the adhesive is planar and is flush with an upper surface of the light boards.

8. The mini LED backlight of claim 2, wherein an upper surface of the adhesive is a semi-circular protrusion, and the protrusion is slightly higher than an upper surface of the light board.

* * * * *